(12) United States Patent
Ahmed et al.

(10) Patent No.: US 7,889,810 B2
(45) Date of Patent: Feb. 15, 2011

(54) METHOD AND APPARATUS FOR A NONLINEAR FEEDBACK CONTROL SYSTEM

(75) Inventors: Walid Khairy Mohamed Ahmed, Tinton Falls, NJ (US); Qing Li, Bridgewater, NJ (US)

(73) Assignee: Pine Valley Investments, Inc., Las Vegas, NV (US)

( * ) Notice: Subject to any disclaimer, the term of this patent is extended or adjusted under 35 U.S.C. 154(b) by 691 days.

(21) Appl. No.: 11/639,999

(22) Filed: Dec. 15, 2006

(65) Prior Publication Data

US 2008/0143437 A1    Jun. 19, 2008

(51) Int. Cl.
H04K 1/02       (2006.01)
H04L 25/03     (2006.01)
H04L 25/49     (2006.01)
H04L 27/00     (2006.01)

(52) U.S. Cl. ...................................... 375/296; 375/295
(58) Field of Classification Search ................ 375/285, 375/296, 346–351, 297, 302; 330/96
See application file for complete search history.

(56) References Cited

U.S. PATENT DOCUMENTS

| | | | |
|---|---|---|---|
| 5,742,201 A | 4/1998 | Eisenberg et al. | |
| 5,745,527 A | 4/1998 | Kelton et al. | |
| 5,995,733 A * | 11/1999 | Roychowdhury | 716/6 |
| 6,043,707 A | 3/2000 | Budnik | |
| 6,140,874 A * | 10/2000 | French et al. | 330/149 |
| 6,141,390 A * | 10/2000 | Cova | 375/297 |
| 6,147,555 A * | 11/2000 | Posner et al. | 330/149 |
| 6,449,465 B1 | 9/2002 | Gailus et al. | |
| 6,456,233 B1 * | 9/2002 | Zhodzishky et al. | 342/357.02 |
| 6,493,543 B1 * | 12/2002 | Shin et al. | 455/126 |
| 6,600,369 B2 | 7/2003 | Mitzlaff | |
| 6,633,199 B2 | 10/2003 | Nielsen et al. | |

(Continued)

FOREIGN PATENT DOCUMENTS

WO    WO 98/51005    11/1998

(Continued)

OTHER PUBLICATIONS

Sowlati, Tridad, Rozenblit Dmitriy, Pullela, Raja, Damgaard, Morten, McCarthy, Evan, Koh, Dongsoo, Ripley, David, Balteanu, Florinel, Gheorghe, Ionel; "Quad-Band GSM/GPRS/Edge Polar Loop Transmitter", IEEE Journal of Solid-State Circuits, vol. 39, No. 12, Dec. 2004, pp. 2179-2189.

(Continued)

*Primary Examiner*—David C Payne
*Assistant Examiner*—Erin M File
(74) *Attorney, Agent, or Firm*—Allen, Dyer, Doppelt, Milbrath & Gilchrist, P.A.

(57) ABSTRACT

A method and apparatus for a nonlinear feedback control system is disclosed, such as for electrical and electronic systems, for pre-distorting a nonlinear device. A nonlinear feedback control system includes a nonlinear device having a first input and a first output. A detection stage is in communication with the first output of the nonlinear device. A derivation stage is in communication with the detection stage, and the derivation stage is in communication with the first input of the nonlinear device.

15 Claims, 8 Drawing Sheets

U.S. PATENT DOCUMENTS

| | | |
|---|---|---|
| 6,650,691 B2 | 11/2003 | Cramer, III |
| 6,731,168 B2 * | 5/2004 | Hedberg et al. ............. 330/149 |
| 6,735,419 B2 | 5/2004 | Mitzlaff |
| 6,826,515 B2 * | 11/2004 | Bernardi et al. ............. 702/191 |
| 6,834,183 B2 | 12/2004 | Black et al. |
| 6,850,574 B2 | 2/2005 | Schwent et al. |
| 6,937,874 B2 | 8/2005 | Cramer, III |
| 7,012,970 B2 | 3/2006 | Greenwood et al. |
| 7,020,215 B2 | 3/2006 | Porco et al. |
| 7,062,236 B2 | 6/2006 | Midtgaard et al. |
| 7,340,223 B1 * | 3/2008 | Wright et al. ................. 455/91 |
| 7,650,079 B2 * | 1/2010 | Preisach ..................... 398/164 |
| 2002/0044667 A1 * | 4/2002 | Stott et al. .................... 381/93 |
| 2003/0031270 A1 | 2/2003 | Giardina et al. |
| 2003/0201934 A1 * | 10/2003 | Asher et al. ............ 342/357.12 |
| 2005/0122166 A1 | 6/2005 | Premakanthan et al. |
| 2005/0130609 A1 | 6/2005 | Nagode et al. |
| 2006/0008027 A1 * | 1/2006 | Gao et al. ................... 375/297 |
| 2006/0128324 A1 | 6/2006 | Tan et al. |
| 2007/0054635 A1 * | 3/2007 | Black et al. ............... 455/127.1 |
| 2007/0128780 A1 * | 6/2007 | Aderhold et al. ............ 438/180 |
| 2008/0129379 A1 * | 6/2008 | Copeland ..................... 330/149 |
| 2008/0130787 A1 * | 6/2008 | Copeland ..................... 375/297 |
| 2008/0130788 A1 * | 6/2008 | Copeland ..................... 375/297 |
| 2008/0130789 A1 * | 6/2008 | Copeland et al. ............. 375/297 |
| 2008/0228292 A1 * | 9/2008 | Reddy ......................... 700/44 |

FOREIGN PATENT DOCUMENTS

WO     WO 2004/056061     7/2004

OTHER PUBLICATIONS

Nezami, Mohamed K., Raytheon Company, "Fundamentals of Power Amplifier Linearization Using Digital Pre-Distortion", Sep. 2004, pp. 54, 56, 58, 60.

www.mpdigest.com, "Large Signal Polar Modulation for High Volume Production", by RFMD® May 2006, pp. 1-4.

International Search Report, International application No. PCT/US2007/025131, International filing date Jul. 12, 2007.

* cited by examiner

METHOD AND APPARATUS FOR A NONLINEAR FEEDBACK CONTROL SYSTEM

FIELD OF THE INVENTION

This invention relates to control systems, specifically to such control systems used in the operation of nonlinear devices.

BACKGROUND OF THE INVENTION

A control system utilizes a device or set of devices to regulate, direct or manage the behavior of systems or other devices. There are various types of control systems, including closed loop systems and open loop systems. Closed loop systems employ feedback, whereas open loop systems use prearranged schemes instead of feedback.

Control systems are used in a multitude of applications in electrical and electronic systems and devices. For example, control systems are used in wireless transmitters and receivers, speaker systems, televisions, computers, and many other applications. One function of control systems in these applications is to ensure that components, such as linear or nonlinear devices, achieve a desired output. For example, a control system may be responsible for controlling the generation of an output signal with a specific power level and waveform quality corresponding to a specific input.

The design of control systems must account for specific requirements and standards that regulate the production, sale, and operation of electrical devices and equipment. For example, wireless standards such as EDGE, GSM, CDMA, UMTS, and many others include strict spectral requirements. As a result, electrical components must preserve waveform quality at various power levels to meet these strict requirements.

In nonlinear devices, such as power amplifiers as well as other devices, waveform quality typically increases with a more linear output response. However, some nonlinear devices operate more efficiently when the output response is nonlinear—for example, when a power amplifier approaches saturation. As a result, there is often a tradeoff between waveform quality and efficiency. For example, when a nonlinear device approaches saturation or starts to exhibit nonlinear qualities (which may improve efficiency), the waveform quality may be degraded and may not meet the specific requirements and standards. Alternatively, if nonlinear devices are set to operate in linear regions to meet quality standards or requirements, then power consumption and current drain may be degraded because the device is operating at a lower efficiency level.

BRIEF SUMMARY

According to one aspect of the nonlinear feedback control system, a nonlinear device has a first input and a first output. A detection stage is in communication with the first output of the nonlinear device. A derivation stage is in communication with the detection stage, and the derivation stage is in communication with the first input of the nonlinear device.

According to another aspect of the nonlinear feedback control system, a method for pre-distorting a nonlinear device comprises generating a first output signal from the nonlinear device. A first plurality of feedback data values is detected from the first output signal. A first pre-distortion value is derived from the first plurality of feedback data values. A first input signal is generated based on the first pre-distortion value, and the first input signal is provided to the nonlinear device.

According to another aspect of the nonlinear feedback control system, a method for pre-distorting a nonlinear device comprises generating an output signal from the nonlinear device. A plurality of feedback data values is detected from the output signal. A variation value is extrapolated from the plurality of feedback data values if an expected output signal value is beyond a range of feedback data values already detected. A pre-distortion value is calculated using the variation value. An input signal is generated based on the pre-distortion value. The input signal is provided to the nonlinear device. The pre-distortion value is processed. The processed pre-distortion value is stored in a look-up-table, and the feedback data value corresponding to the processed pre-distortion value is stored in the look-up-table.

Other systems, methods, features and advantages of the nonlinear feedback control system will be, or will become, apparent to one with skill in the art upon examination of the following figures and detailed description. It is intended that all such additional systems, methods, features and advantages be included within this description.

BRIEF DESCRIPTION OF THE DRAWINGS

The components in the figures are not necessarily to scale, emphasis instead being placed upon illustrating the principles of the invention. Moreover, in the figures, like referenced numerals designate corresponding parts throughout the different views.

DETAILED DESCRIPTION OF THE PRESENTLY PREFERRED EMBODIMENTS

Figure 1:
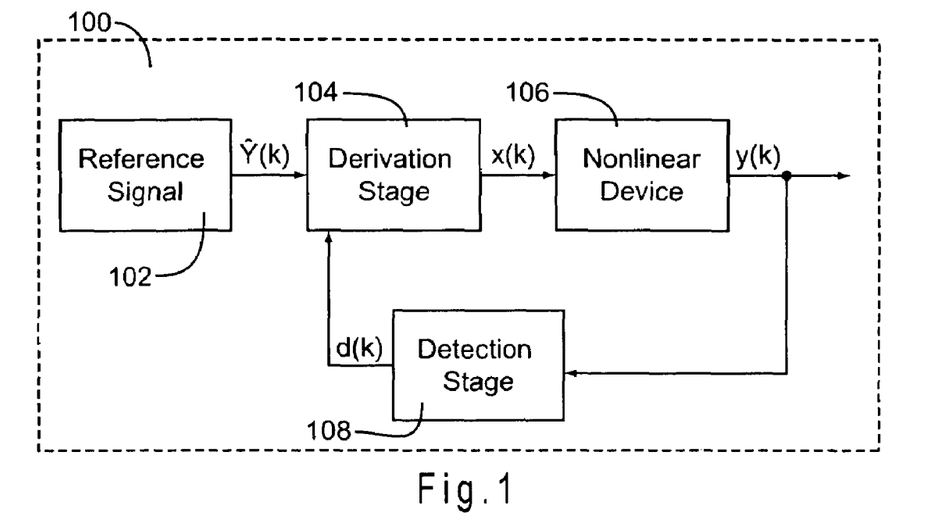
FIG. 1 is a block diagram illustrating a nonlinear feedback control system.

FIG. 1 is a block diagram illustrating a module 100 that may utilize nonlinear feedback control devices, systems, apparatus and methods described herein. The module 100 may be a printed circuit board ("PCB"), a single chip, multiple chip sets, or anyone of a variety of electrical and electronic platforms used in wireless systems, speaker systems, computers, or other electrical devices and equipment.

More specifically, FIG. 1 illustrates relevant portions of a nonlinear feedback control system. The control system includes a nonlinear device 106, a detection stage 108 in communication with an output of the nonlinear device 106, a derivation stage 104 in communication with the detection stage 108, a reference signal source 102 in communication with the derivation stage 104, and the derivation stage 104 is in communication with an input of the nonlinear device 106.

In operation, the nonlinear device 106 outputs a digital, analog, or radio frequency ("RF") signal. The signal value at the output of the nonlinear device 106 is represented by y(k), where k represents a data point. The detection stage 108 samples data from the output signal. For example, the detection stage 108 may couple a RF signal, convert the RF signal to an analog signal, filter and process the analog signal, and convert it to a digital signal to create feedback data values, d(k), that correspond to the previous signal values at the output of the nonlinear device 106. For example, the feedback data values, d(k), may be digital representations of y(k−n), y(k−n−1), y(k−n−2) . . . , where k represents a data point and n represents a loop delay. A plurality of feedback data values, d(k), is provided to the derivation stage 104 in which a pre-distortion value, p(k), is derived and a variety of processing is performed, as discussed below. The pre-distortion value, p(k), corresponds to x(k), which is the signal value at the input of the nonlinear device 106, where k represents a data point. For example, a reference signal, Ŷ(k), from the reference signal source 102 is provided to the derivation stage 104, where k represents a data point. The reference signal, Ŷ(k), which is used for calculation purposes in the derivation stage 104, represents a waveform of an expected output signal without nonlinear distortion. Acting as an inverse transfer function to invert the nonlinearity of the nonlinear device 106, the pre-distortion values, p(k), are used to generate an input signal, x(k). The input signal, x(k), is then provided to the nonlinear device 106, and the resultant transfer function of the cascade of the derivation stage 104 and the nonlinear device 106 is equivalent to a linear response that delivers a good quality waveform at the output of the nonlinear device 106. Therefore, the waveform of the output signal, y(k), mimics the waveform of the reference signal, Ŷ(k).

The nonlinear device 106, for example, may be a power amplifier or any one of a variety of electrical components that exhibit nonlinear qualities. Also, the nonlinear device 106 may have any number of inputs and outputs. A single input and output arrangement may be used for a one dimensional system, such as a control system for a speaker. Alternatively, a multi-dimensional system, such as a wireless transmitter, may require multiple inputs and outputs.

Figure 2:
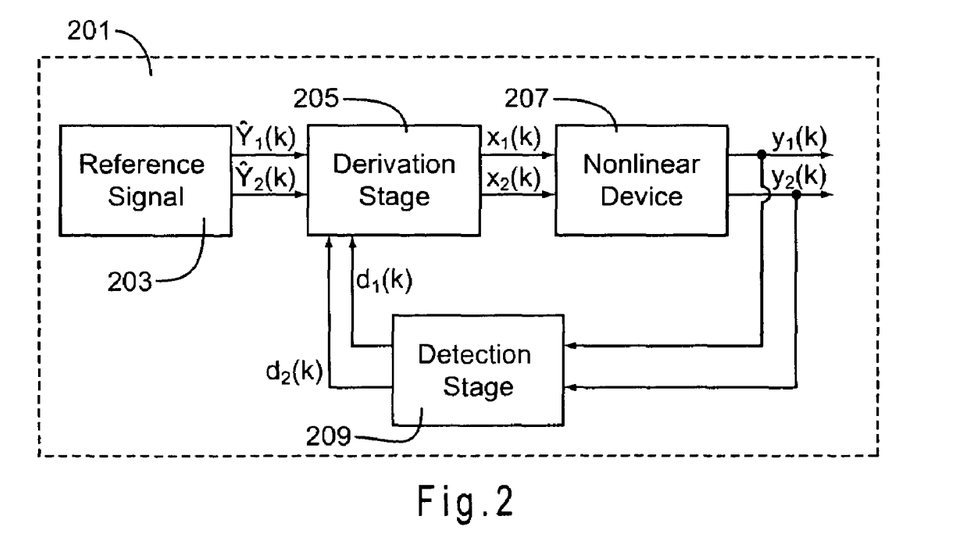
FIG. 2 is a block diagram illustrating a nonlinear feedback control system, similar to the control system of FIG. 1, utilizing two signal paths.

FIG. 2 illustrates a multi-dimensional nonlinear feedback control system having two separate communication signals arranged within a module 201, which is similar to the module 100. A reference signal source 203 provides two reference signals, Ŷ$_1$(k) and Ŷ$_2$(k), to a derivation stage 205. The derivation stage 205 supplies two input signals, x$_1$(k) and x$_2$(k), to a nonlinear device 207, which provides two corresponding output signals, y$_1$(k) and y$_2$(k). For example, the two reference signals may be I and Q signals or amplitude and phase signals of a wireless transmitter. Other types of higher order systems, such as three dimensional laser location monitoring systems, also may benefit from the nonlinear feedback control system.

A detection stage 209 samples data from each of the two output signals. For example, the detection stage may sample the output signals in the same way described above with reference to the detection stage 108 of FIG. 1. Based on the sampled data, the detection stage 209 provides feedback signals, d$_1$(k) and d$_2$(k), to the derivation stage 205. Also, the two inputs and two outputs of the nonlinear device 207 illustrated in FIG. 2 represent the concept that two types of signals, such as amplitude and phase signals, as mentioned above, may be utilized in the nonlinear feedback control system. However, the nonlinear device 207 may utilize a single input and a single output, where the single input is able to receive an input signal that includes multiple types of signals, such as both amplitude and phase signals, and the single output is able to produce an output signal that includes multiple types of signals, such as both amplitude and phase signals.

The detection stages 108 and 209 may incorporate any number of couplers or measurement devices, step attenuators, gain adjustors, RF-to-analog converters, filters, analog-to-digital converters ("ADCs"), digital signal processors, and other electrical components. Also, the detection stages 108 and 209 may be incorporated into a PCB with discrete components, a separate mixed signal IC or be on the same mixed signal chip of the derivation stage 104 or 205.

Figure 3:
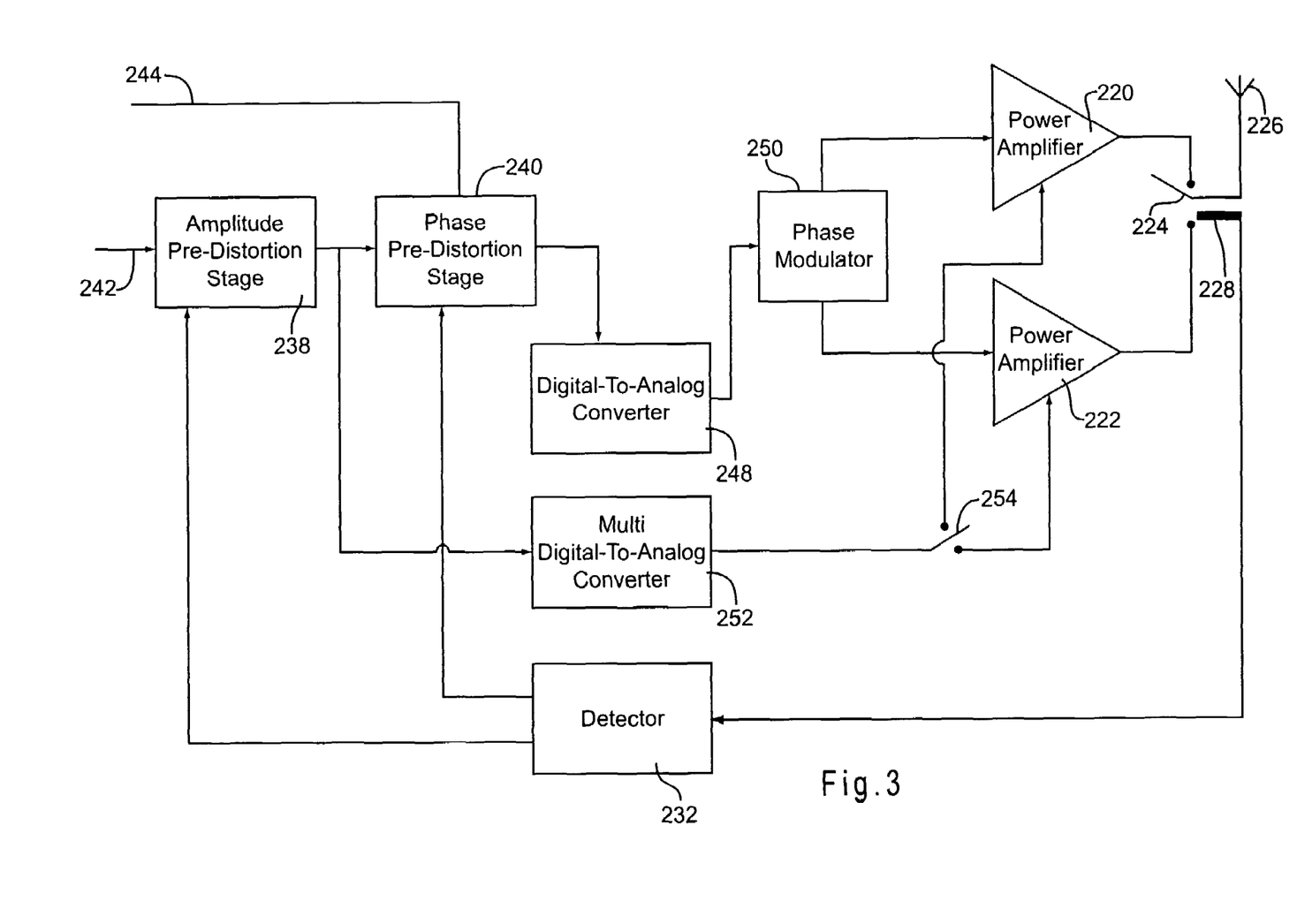
FIG. 3 is a schematic diagram illustrating a wireless transmitter using a nonlinear feedback control system.

FIG. 3 illustrates an exemplary architecture for a multi-dimensional nonlinear feedback control system. For example, FIG. 3 may represent a GSM/EDGE transmitter where an output of a power amplifier 220, which is used for low band transmissions, and an output of a power amplifier 222, which is used for high band transmissions, are in communication with an antenna 226 via a switch 224. The output signal of either the power amplifier 220 or the power amplifier 222 includes both an amplitude and phase signal. A coupler 228 couples these output amplitude and phase signals and provides them to a detector 232. The detector 232 creates feedback data values for both the amplitude signal and phase signal.

The amplitude feedback data values are provided to an amplitude pre-distortion stage 238, which is in communication with a first output of the detector 232. The amplitude pre-distortion stage 238 is similar to the derivation stage 205 of FIG. 2. Also, an amplitude reference signal 242 is provided to the amplitude pre-distortion stage 238. The amplitude pre-distortion stage 238 derives an amplitude pre-distortion value. The derivation of a pre-distortion value is discussed in detail below. The amplitude pre-distortion value is provided to a multi digital-to-analog converter ("Multi DAC") 252, which is in communication with the amplitude pre-distortion stage 238.

The Multi DAC 252 converts the digital amplitude pre-distortion value to an analog signal, such as a biasing current. This analog amplitude signal is then provided to an input of the power amplifier 220 or power amplifier 222 via a switch 254, where the Multi DAC 252 is in communication with both power amplifiers 220 and 222. Also, the amplitude pre-distortion value is provided to a phase pre-distortion stage 240, which is in communication with the amplitude pre-distortion stage 238.

The phase feedback data values are provided to the phase pre-distortion stage 240, which is in communication with a second output of the detector 232. The phase pre-distortion stage 240 is similar to the derivation stage 205 of FIG. 2. Also, a phase reference signal 244 is provided to the phase pre-distortion stage 240. The phase pre-distortion stage 240 may include an adder. The phase pre-distortion stage 240 derives a phase pre-distortion value, which is generated based on the amplitude pre-distortion value. The derivation of a pre-distortion value is discussed in detail below. The phase pre-distortion value is provided to a digital-to-analog converter ("DAC") 248, which is in communication with the phase pre-distortion stage 240.

The DAC 248 converts the digital phase pre-distortion value to an analog signal. This analog phase signal is then provided to a phase modulator 250, which is in communication with the DAC 248. The phase modulator 250 up converts or moves the analog phase signal to a carrier frequency. Then the carrier frequency is provided to an input of the power amplifier 220 and power amplifier 222, where the phase modulator 250 is in communication with both power amplifiers 220 and 222. Because the input analog amplitude and phase signals have been generated using the nonlinear feedback control system, the output response of the power amplifier 220 or 222, in regards to the amplitude and phase signals, will have a good quality waveform, as discussed above.

Figure 4:
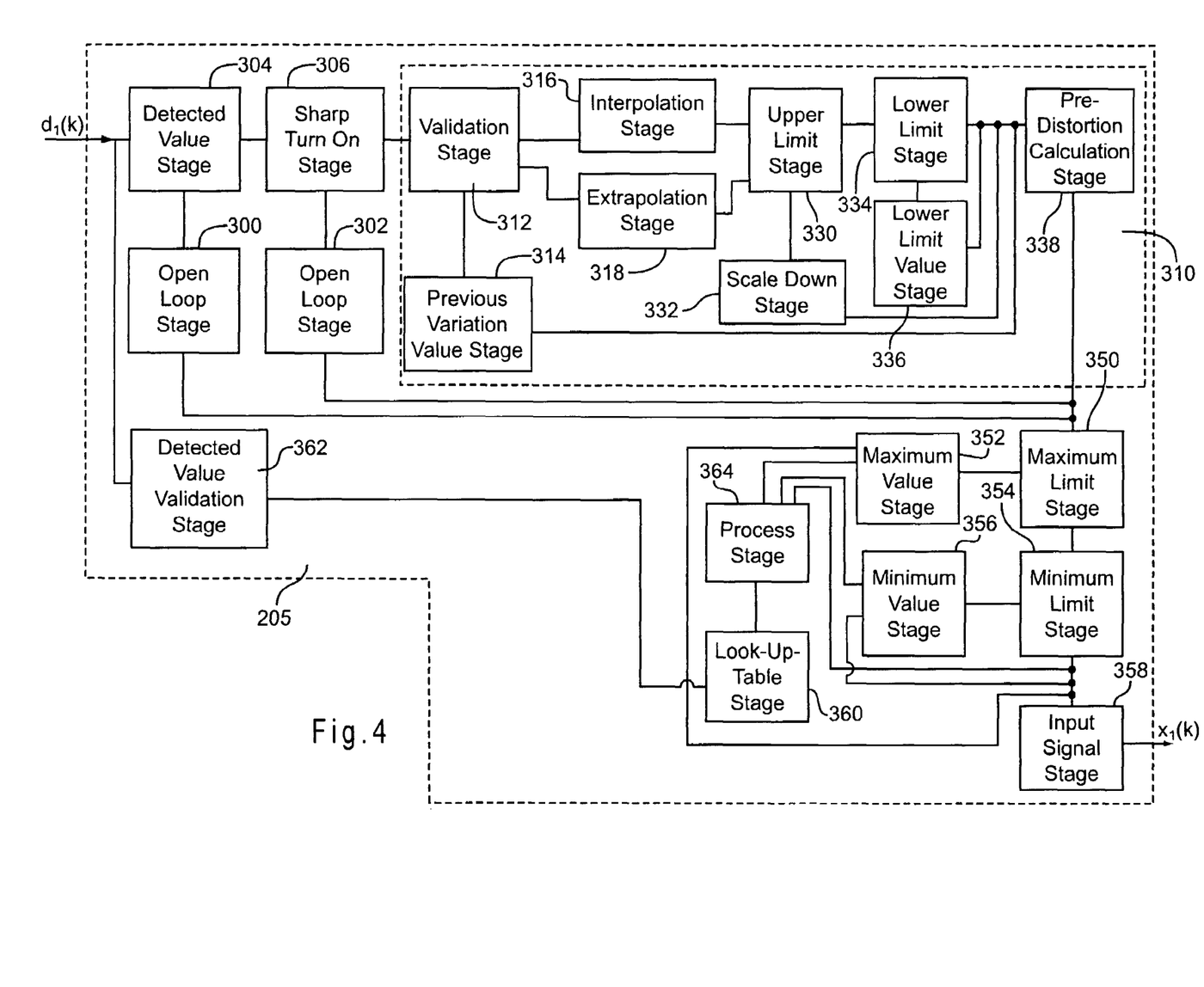
FIG. 4 is a block diagram illustrating an exemplary architecture for the derivation stage of FIG. 2.

FIG. 4 illustrates an exemplary architecture for the derivation stage 205 of FIG. 2, which is similar to the derivation stage 104 of FIG. 1. For example, a detected value stage 304, which is capable of detecting feedback data values, such as $d_1(k)$, is in communication with one of the outputs of the detection stage 209 of FIG. 2. The detected value stage 304 is in communication with an open loop stage 300 and a sharp turn-on stage 306. The open loop stage 300 includes a predefined pre-distortion value function or pre-load table to generate an open loop pre-distortion value. An output of the open loop stage 300 is in communication with an input of a maximum limit stage 350. The sharp turn-on stage 306, which is capable of analyzing changing data slopes, is in communication with an open loop stage 302 and a validation stage 312. The open loop stage 302 includes a predefined pre-distortion value function or pre-load table to generate an open loop pre-distortion value. An output of the open loop stage 302 is in communication with an input of the maximum limit stage 350.

Furthermore, the validation stage 312 is in communication with a previous variation value stage 314, an interpolation stage 316, and an extrapolation stage 318. The previous variation value stage 314 includes a function to scale a previous variation value. The previous variation value stage 314 is in communication with an input of a pre-distortion calculation stage 338. The extrapolation stage 318 includes a function to extrapolate a variation value, v(k), which represents the changes or deviation between the input, x(k), and output, y(k), of the nonlinear device 207. The interpolation stage 316 may contain a similar function to interpolate a variation value. The numerical method and the associated order of the equations depend on sample rate, data rate, and hardware limitations. An output of the extrapolation stage 318 and an output of the interpolation stage 316 are in communication with an upper limit stage 330.

The upper limit stage 330 is in communication with a scale down stage 332 and a lower limit stage 334. The scale down stage 332 includes a scaling function. An output of the scale down stage 332 is in communication with an input of the pre-distortion calculation stage 338. The lower limit stage 334 is in communication with a lower limit value stage 336 and the pre-distortion calculation stage 338. The lower limit value stage 336 is in communication with an input of the pre-distortion calculation stage 338. The pre-distortion calculation stage 338 is in communication with a maximum limit stage 350. Also, stage 310 represents a possible closed loop stage.

The maximum limit stage 350 is in communication with a maximum value stage 352 and a minimum limit stage 354. The maximum value stage 352 is in communication with an input signal stage 358 and a process stage 364. The minimum limit stage 354 is in communication with a minimum value stage 356, an input signal stage 358, and the process stage 364. The minimum value stage 356 is in communication with the input signal stage 358 and the process stage 364. A look-up-table stage 360 is in communication with the process stage 364 and a detected value validation stage 362. The detected value validation stage 362, which is capable of detecting feedback data values, such as $d_1(k)$, is in communication with one of the outputs of the detection stage 209 of FIG. 2. The input signal stage 358 includes electrical hardware components, such as filters, DACs, and gain adjustors, to generate an analog input signal, such as $x_1(k)$. The look-up-table stage 360 includes electronic memory architecture. Also, the above mentioned stages may be implemented using hardware components, software architectures, or a combination thereof.

Figure 5:
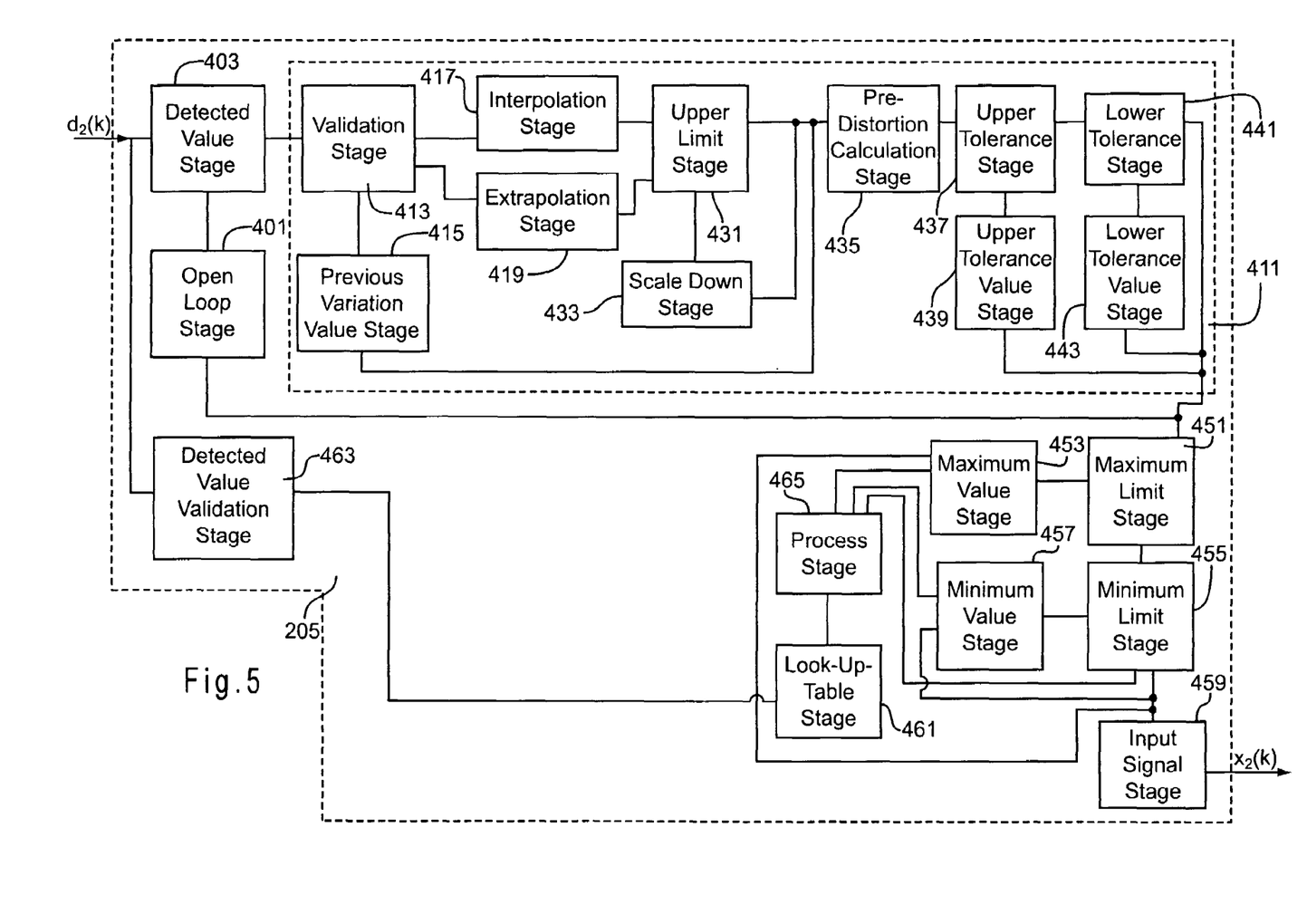
FIG. 5 is a block diagram illustrating another exemplary architecture for the derivation stage of FIG. 2.

FIG. 5 illustrates another exemplary architecture for the derivation stage 205, which is similar to the derivation stage 104 of FIG. 1. A detected value stage 403, which is capable of detecting feedback data values, such as $d_2(k)$, is in communication with one of the outputs of the detection stage 209 of FIG. 2. The detected value stage 403 is in communication with an open loop stage 401 and a validation stage 413. The open loop stage 401 includes a predefined pre-distortion value function or a pre-load table to generate an open loop pre-distortion value. An output of the open loop stage 401 is in communication with an input of a maximum limit stage 451.

The validation stage 413 is in communication with a previous variation value stage 415, an interpolation stage 417, and an extrapolation stage 419. The previous variation value stage 415 includes a function to scale a previous variation value. The previous variation value stage 415 is in communication with an input of a pre-distortion calculation stage 435. The extrapolation stage 419 includes a function to extrapolate a variation value, v(k), which represents the changes or deviation between the input, x(k), and output, y(k), of the nonlinear device 207. The interpolation stage 417 may contain a similar function to interpolate a variation value. The numerical method and the associated order of the equations depend on sample rate, data rate, and hardware limitations. An output of the extrapolation stage 419 and an output of the interpolation stage 417 are in communication with an upper limit stage 431.

The upper limit stage 431 is in communication with a scale down stage 433 and the pre-distortion calculation stage 435. The scale down stage 433 includes a scaling function. An output of the scale down stage 433 is in communication with the pre-distortion calculation stage 435. The pre-distortion calculation stage 435 is in communication with an upper tolerance stage 437. The upper tolerance stage 437 is in communication with an upper tolerance value stage 439 and the lower tolerance stage 441. The upper tolerance value stage 439 is in communication with the maximum limit stage 451. The lower tolerance stage 441 is in communication with a lower tolerance value stage 443 and the maximum limit stage 451. The lower tolerance value stage 443 is in communication with the maximum limit stage 451. Also, stage 411 represents a possible closed loop stage.

Furthermore, the maximum limit stage 451 is in communication with a maximum value stage 453 and a minimum limit stage 455. The maximum value stage 453 is in communication with an input signal stage 459 and a process stage 465. The minimum limit stage 455 is in communication with a minimum value stage 457, the input signal stage 459, and the process stage 465. The minimum value stage 457 is in communication with the input signal stage 459 and the process stage 465. A look-up-table stage 461 is in communication with the process stage 465 and a detected value validation stage 463. The detected value validation stage 463, which is capable of detecting feedback data values, such as $d_2(k)$, is in communication with one of the outputs of the detection stage 209 of FIG. 2. The input signal stage 459 includes electrical hardware components, such as filters, DACs, and gain adjustors, to generate an analog input signal, such as $x_2(k)$. The look-up-table stage 461 includes electronic memory architecture. Also, the above mentioned stages may be implemented using hardware components, software architectures, or a combination thereof.

Figure 6:
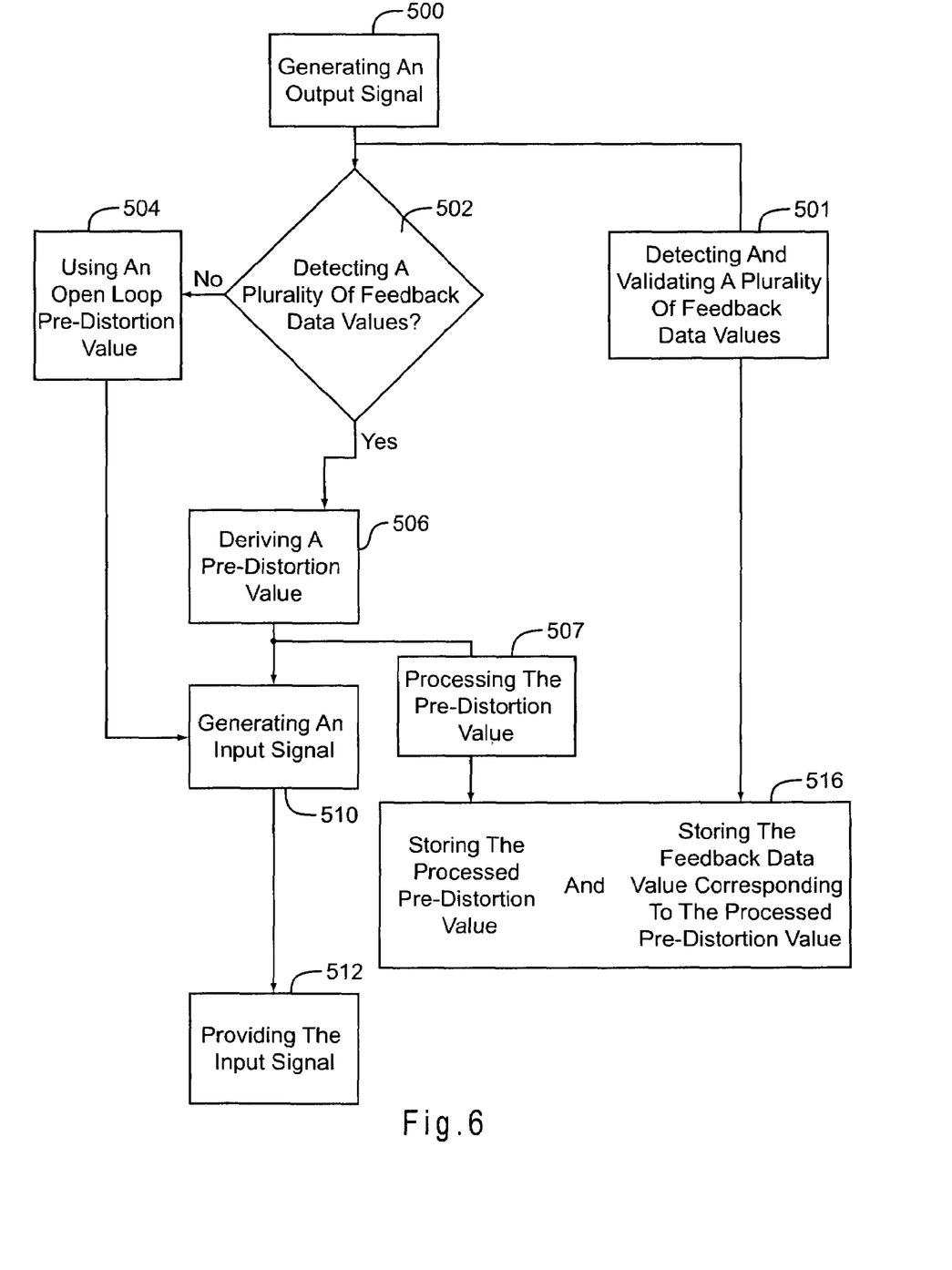
FIG. 6 is a flow chart illustrating a general method for pre-distorting a non-linear device, such as the non-linear devices in FIGS. 1 and 2.

FIG. 6 illustrates a general method for pre-distorting a nonlinear device, such as nonlinear device 106 or 207. For example, the nonlinear device generates an output signal, as in block 500. Then the function of detecting a plurality of feedback data values, d(k), such as at least two feedback data values occurs, as in block 502. If the plurality of feedback data values is not detected, which may occur due to loop delay, then an open loop pre-distortion value, which is generated from a predefined pre-distortion function or pre-load table, is used, as in block 504, to generate an input signal, as in block 510. That input signal is then provided to the nonlinear device, as in block 512.

If the plurality of feedback data values is detected, then a pre-distortion value, p(k) is derived from the plurality of feedback data values, as in block 506. An input signal is generated based on the pre-distortion value, p(k), as in block 510. That input signal is then provided to the nonlinear device, as in block 512. Also, the pre-distortion value, p(k), is processed, as in block 507. The processing may entail filtering as well as delaying the pre-distortion value, p(k), to correspond with an appropriate feedback data value, d(k). Furthermore, the function of detecting, similar to block 502, and validating a plurality of feedback data values, d(k), occurs, as in block 501. Then a feedback data value and a corresponding processed pre-distortion value, which is substantially the digital representation of the input signal, x(k), are stored in a look-up-table, as in block 516.

Figure 7:
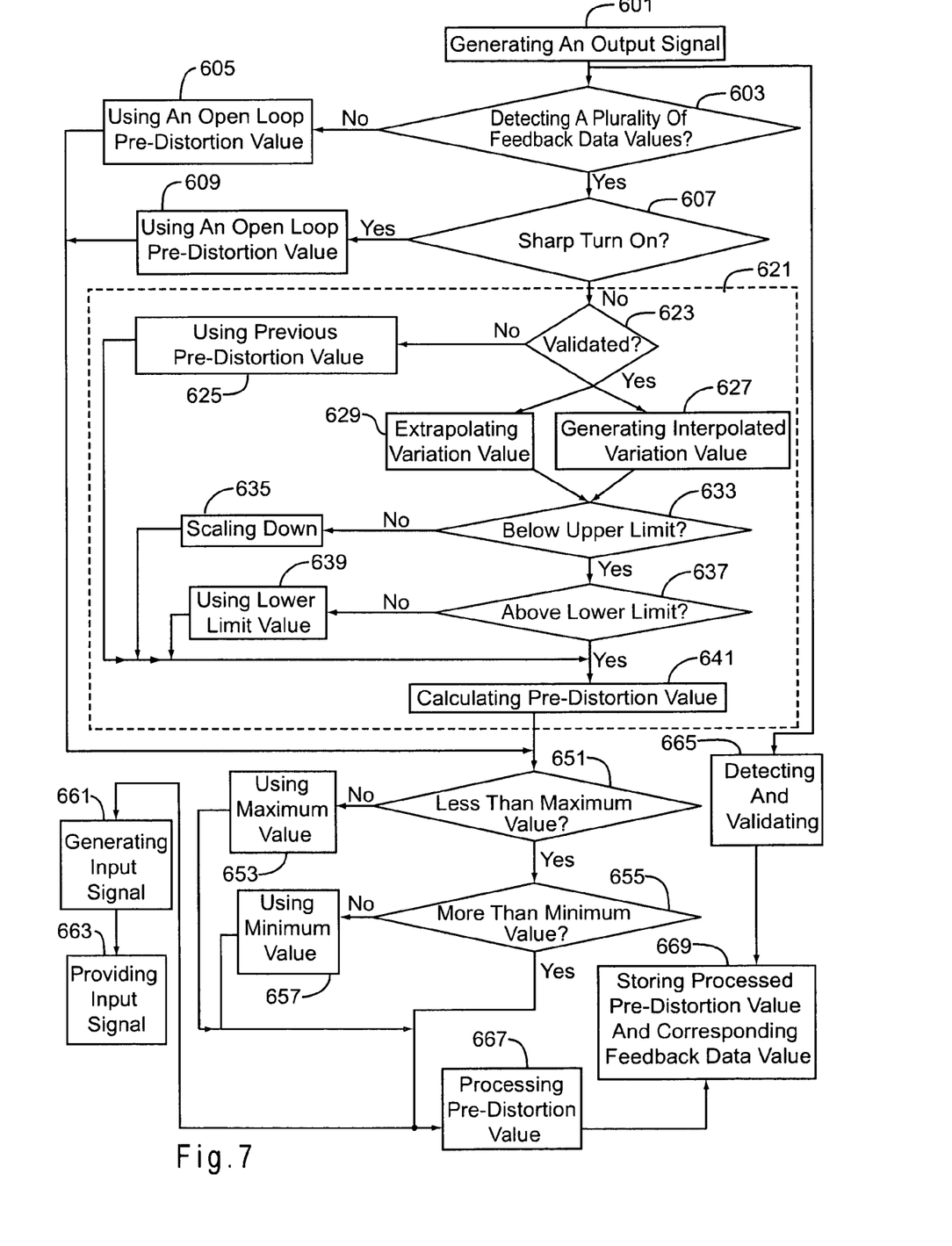
FIG. 7 is a flow chart illustrating an exemplary method for pre-distorting a non-linear device corresponding to the architecture of FIG. 4.

FIG. 7 illustrates a method for pre-distorting a nonlinear device corresponding to the architecture of FIG. 4. In FIG. 7, for example, the nonlinear device generates an output signal, as in block 601. Then the function of detecting a plurality of feedback data values, d(k), such as at least two feedback data values, occurs, as in block 603. For example, this function is implemented by the detected value stage 304 of FIG. 4. If the plurality of feedback data values is not detected, which may occur due to loop delay, then an open loop pre-distortion value, which is generated from a predefined pre-distortion function or pre-load table, is used, as in block 605. The open loop pre-distortion value is then sent to a checking block 651, bypassing block 621, which corresponds roughly to block 506 of FIG. 6. If the plurality of feedback data values, d(k), is detected, then the feedback data values are checked for a sharp turn-on, as in block 607. If the feedback data values are below a specified turn-on threshold, then an open loop pre-distortion value, which is generated from a predefined pre-distortion function or pre-load table, is used, as in block 609. Being below the specified turn-on threshold means that a sharp turn-on exists. The open loop pre-distortion value is then sent to the checking block 651, bypassing block 621. If the feedback data values are above a specified turn on threshold, then a validating function will occur, as in block 623. For example, the validating function is implemented by the validation stage 312 of FIG. 4.

The validating function includes, but is not limited to, comparing the noise level of the feedback data values, d(k), with a threshold noise level. If the noise level of a certain number of the plurality of feedback data values, such as at least one, is above the threshold noise level, then those feedback data values will be discarded and a previous variation value that was extrapolated or interpolated, v(k−1), will be used, as in block 625, to be sent to a calculating pre-distortion value block 641. However, if the noise level of a certain number of the plurality of feedback data values, d(k), is below the threshold noise level, then a variation value, v(k), is extrapolated using the feedback data values, d(k), if the expected output signal value is beyond a range of feedback data values already detected, as in block 629. Other mathematical values, in addition to the feedback data values, may be used for the extrapolation. Alternatively, a variation value is interpolated from stored feedback data values and stored processed pre-distortion values if the expected output signal value is within a range of feedback data values already detected, as in block 627. For example, the extrapolation and interpolation are implemented by the extrapolation stage 318 and interpolation stage 316 of FIG. 4, respectively.

An extrapolated variation value or an interpolated variation value is checked to see if its value is above a certain upper limit, as in block 633. If the variation value is above the upper limit, the system may be noisy and unstable. If the variation value is not less than the upper limit, then the variation value is scaled down, as in block 635, and is used to calculate a pre-distortion value, as in block 641. If the variation value is less than the upper limit, then it is checked to see if it is more than a lower limit, as in block 637. If the variation value is not more than the lower limit, then the lower limit value is used, as in block 639, to calculate a pre-distortion value, as in block 641. If the variation value is more than the lower limit, then it is used for calculating the pre-distortion value, as in block 641. For example, the calculation of the pre-distortion value is implemented by the pre-distortion calculation stage 338 of FIG. 4.

Then the pre-distortion value is checked to see if it is less than a maximum value, as in block 651. If it is not, then the maximum value is used, as in block 653, to be sent to block 661, as well as block 667 if the pre-distortion value was calculated in block 641. If the pre-distortion value is less than the maximum value, then it is checked to see if it is more than a minimum value, as in block 655. If it is not, then the minimum value is used, as in block 657, to be sent to block 661, as well as block 667 if the pre-distortion value was calculated in block 641. The maximum and minimum values may vary based on hardware limitations. Furthermore, if the pre-distortion value is more than the minimum value, then it is smoothed, by averaging and filtering, and used to generate an input signal, as in block 661. For example, the generation of the input signal is implemented by the input signal stage 358 of FIG. 4. The input signal is provided to the nonlinear device, as in block 663. Also, if a pre-distortion value was sent to block 667, then it will be processed.

The processing may entail filtering as well as delaying the pre-distortion value, p(k), to correspond with an appropriate feedback data value, d(k). For example, the processing is implemented by the process stage 364 of FIG. 4. Also, the function of detecting, similar to block 603, and validating, similar to block 623, a plurality of feedback data values, d(k), occurs, as in block 665. Then a feedback data value and a corresponding processed pre-distortion value, which is substantially the digital representation of the input signal, x(k), are stored in a look-up-table, as in block 669. Anyone of a variety of numerical techniques can be used for the extrapolation or interpolation of the variation value, v(k), and the calculation of the pre-distortion value, p(k), as well as other math computations discussed above. For example, Spline, Cubic-Hermite, Linear, Polynomial, or other mathematical techniques may be used. Also, values associated with the reference signal, $\hat{Y}(k)$, are used in the mathematical computations discussed above.

Figure 8:
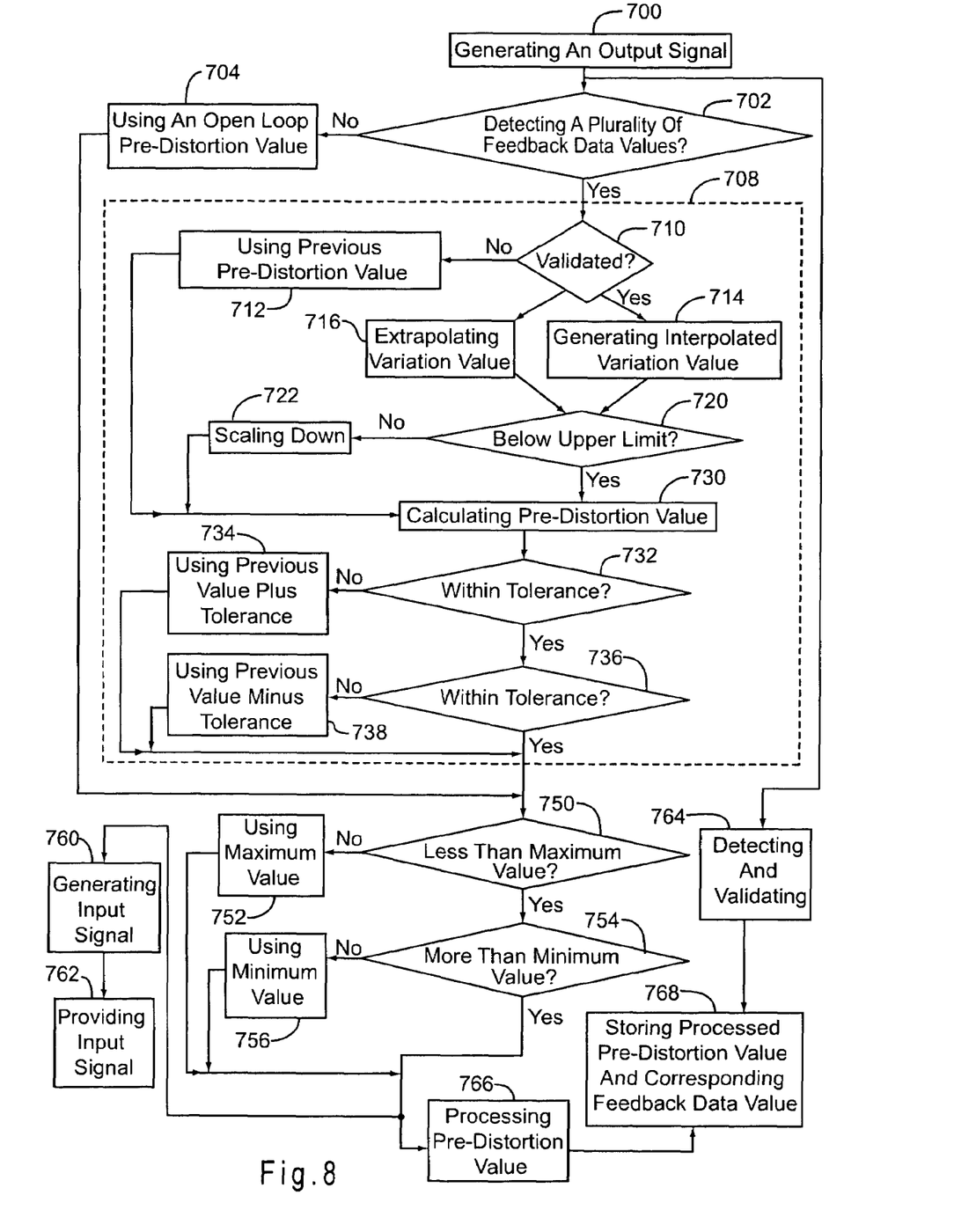
FIG. 8 is a flow chart illustrating an exemplary method for pre-distorting a non-linear device corresponding to the architecture of FIG. 5.

FIG. 8 illustrates a method for pre-distorting a nonlinear device corresponding to the architecture of FIG. 5. In FIG. 8, for example, the nonlinear device generates an output signal, as in block 700. Then the function of detecting a plurality of feedback data values, d(k), such as at least two feedback data values, occurs, as in block 702. For example, this function is implemented by the detected value stage 403 of FIG. 5. If the plurality of feedback data values is not detected, which may occur due to loop delay, then an open loop pre-distortion value, which is generated from a predefined pre-distortion function or pre-load table, is used, as in block 704. The open loop pre-distortion value is then sent to a checking block 750, bypassing block 708, which corresponds roughly to block 506 of FIG. 6. If the plurality of feedback data values is detected, then a validating function will occur, as in block 710. For example, the validating function is implemented by the validation stage 413 of FIG. 5.

The validating function includes, but is not limited to, comparing the noise level of the feedback data values, d(k), with a threshold noise level. If the noise level of a certain number of the plurality of feedback data values, such as at least one, is above the threshold noise level, then those feedback data values will be discarded and a previous variation value that was extrapolated or interpolated, v(k−1), will be used, as in block 712, to be sent to a calculating pre-distortion value block 730. However, if the noise level of a certain number of the plurality of feedback data values, d(k), is below the threshold noise level, then a variation value, v(k), is extrapolated using the feedback data values, d(k), if the expected output signal value is beyond a range of feedback data values already detected, as in block 716. Other mathematical values, in addition to the feedback data values, may be used for the extrapolation. Alternatively, a variation value is interpolated from stored feedback data values and stored processed pre-distortion values if the expected output signal value is within a range of feedback data values already detected, as in block 714. For example, the extrapolation and interpolation are implemented by the extrapolation stage 419 and interpolation stage 417 of FIG. 5, respectively.

An extrapolated variation value or an interpolated variation value is checked to see if its value is above a certain upper limit, as in block 720. If the variation value is above the upper limit, the system may be noisy and unstable. If the variation value is not less than the upper limit, then the variation value is scaled down, as in block 722, and is used to calculate a pre-distortion value, as in block 730. If the variation value is less than the upper limit, then it is used for calculating the pre-distortion value, as in block 730. For example, the calculation of the pre-distortion value is implemented by the pre-distortion calculation stage 435 of FIG. 5.

Then the pre-distortion value, is checked to see if it is less than the previous pre-distortion value plus a tolerance limit value, as in block 732. If it is not, then the previous pre-distortion value plus the tolerance limit value is used, as in block 734, to be sent to the checking block 750. If the pre-distortion value is less than the previous pre-distortion value plus the tolerance limit value, then it is checked to see if it is more than the previous pre-distortion value minus a tolerance limit value, as in block 736. If it is not, then the previous pre-distortion value minus the tolerance value is used, as in block 738, to be sent to checking block 750. If the pre-distortion value is more than the previous pre-distortion value minus the tolerance limit value, then it is provided to the checking block 750.

The pre-distortion value is checked to see if it is less than a maximum value, as in block 750. If it is not, then the maximum value is used, as in block 752, to be sent to block 760, as well as block 766 if the pre-distortion value was calculated in block 730. If the pre-distortion value is less than the maximum value, then it is checked to see if it is more than a minimum value, as in block 754. If it is not, then the minimum value is used, as in block 756, to be sent to block 760, as well as block 766 if the pre-distortion value was calculated in block 730. The maximum and minimum values may vary based on hardware limitations. Furthermore, if the pre-distortion value is more than the minimum value, then it is smoothed, by averaging and filtering, and used to generate an input signal, as in block 760. For example, the generation of the input signal is implemented by the input signal stage 459 of FIG. 5. The input signal is provided to the nonlinear device, as in block 762. Also, if a pre-distortion value was sent to block 766, then it will be processed.

The processing may entail filtering as well as delaying the pre-distortion value, p(k), to correspond with an appropriate feedback data value, d(k). For example, the processing is implemented by the process stage 465 of FIG. 5. Also, the function of detecting, similar to block 702, and validating, similar to block 710, a plurality of feedback data values, d(k), occurs, as in block 764. Then a feedback data value and a corresponding processed pre-distortion value, which is substantially the digital representation of the input signal, x(k), are stored in a look-up-table, as in block 768. Anyone of a variety of numerical techniques can be used for the extrapolation or interpolation of the variation value, v(k), and the calculation of the pre-distortion value, p(k), as well as other math computations discussed above. For example, Spline, Cubic-Hermite, Linear, Polynomial, or other mathematical techniques may be used. Also, values associated with the reference signal, $\hat{Y}(k)$, are used in the mathematical computations discussed above.

Figure 9:
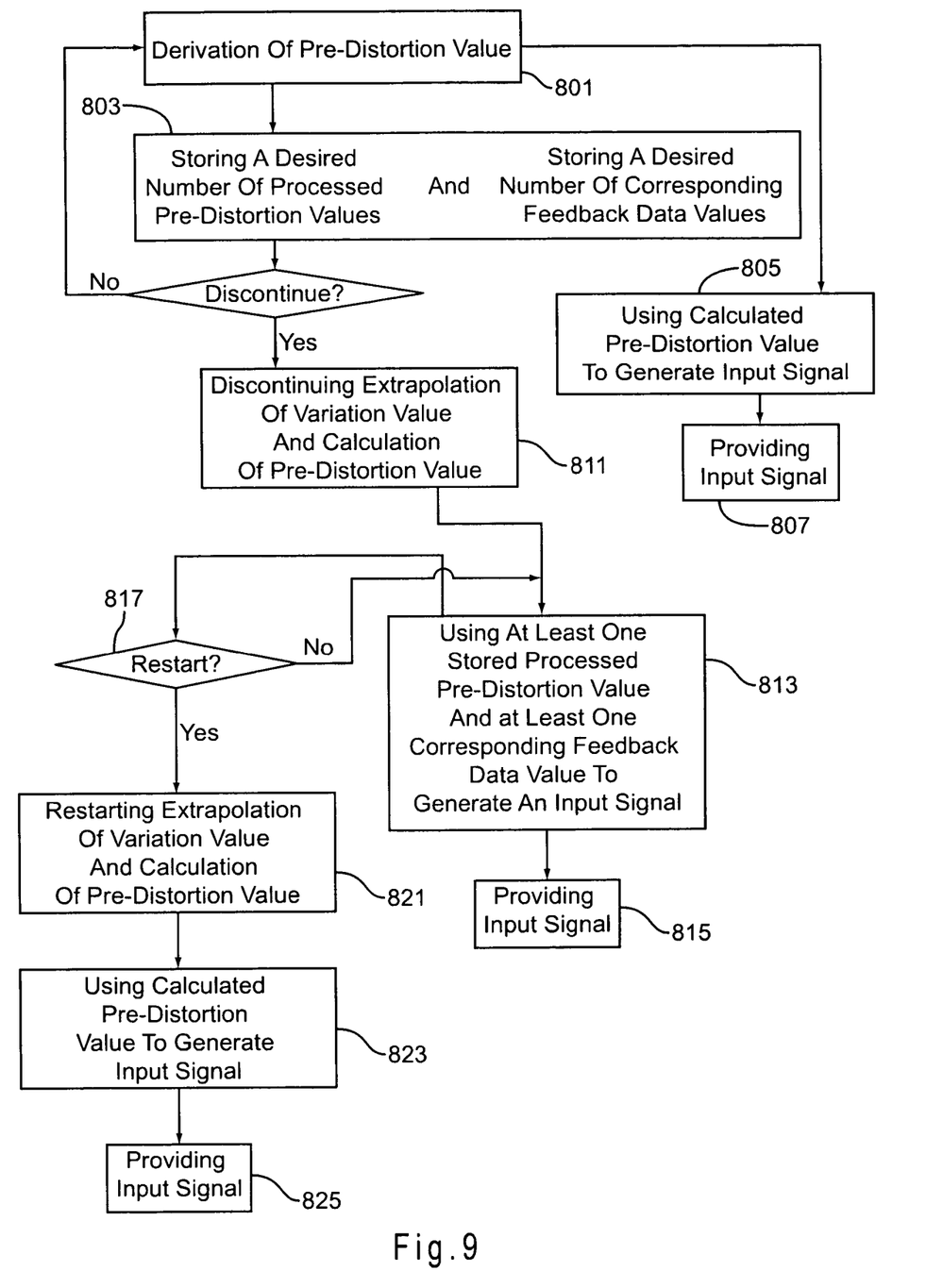
FIG. 9 is a flow chart illustrating a general mode of operation of a nonlinear feedback control system, such as the control systems of FIGS. 1 and 2.

FIG. 9 illustrates a method for a general mode of operation using the nonlinear feedback control system. The methods described below may be similar to the methods of FIGS. 6, 7, and 8. For example, when a nonlinear system turns on or when it is already activated, the derivation of a pre-distortion value, p(k), may occur, as in block 801. The derivation of the pre-distortion value can be accomplished by anyone of a variety of methods, such as block 621 of FIG. 7 or block 708 of FIG. 8. The pre-distortion value is then used to generate an input signal, as in block 805. The input signal is provided to the nonlinear device, as in block 807.

Occurring in parallel, a desired number of processed pre-distortion values and corresponding feedback data values are stored in a look-up-table, as in block 803. After a desired number of processed pre-distortion values and corresponding feedback data values are stored, there is an option to discontinue the derivation of the pre-distortion values, as in block 809. If discontinuation is not chosen, then the system will continue to derive the pre-distortion values and refresh the look-up-table. However, if discontinuation is chosen, the extrapolation of a variation value and calculation of a pre-distortion value are discontinued, as in block 811. More or less features described in the methods of FIGS. 6, 7, and 8 may be discontinued to save current. For example, interpolation of a variation value, such as in blocks 627 and 714, may also be discontinued.

After the discontinuation, the stored feedback data values and the corresponding processed pre-distortion values, such as at least one stored feedback value and at least one stored processed pre-distortion value, can be used to generate an input signal via interpolation or other methods, as in block 813. Then the input signal is provided to the nonlinear device, as in block 815.

While this is occurring, there is an option to restart the derivation of the pre-distortion values, as in block 817. If it is indicated not to restart, the system will continue to rely on the stored data. If it is indicated to restart, then restarting the extrapolation of a variation value and calculation of a pre-distortion value, as well as other functions that were discontinued, will occur, as in block 821. Restarting the derivation of the pre-distortion values, as well as other functions, may be based on a variety of factors. For example, if there is a temperature change or a certain time lapse, the system can derive new pre-distortion values to generate an input signal, as in block 823. Then the input signal is provided to the nonlinear device, as in block 825. Also, the new processed pre-distortion values as well as the corresponding feedback data values are stored in the look-up-table as discussed in similar methods above. A variety of timing patterns may be used with the discontinuation and restart functions discussed above.

Other approaches may be implemented for the purpose of embodying the nonlinear feedback control devices, systems, apparatus and methods. For example, the apparatus stages as well as the method features discussed above may be mixed and matched to accomplish similar results.

It is intended that the foregoing detailed description be regarded as illustrative rather than limiting, and that it be understood that the following claims, including all equivalents, are intended to define the scope of this invention.

The invention claimed is:

1. A method for pre-distorting a nonlinear device, comprising:
   generating a first output signal from the nonlinear device;
   detecting a first plurality of feedback data values from the first output signal;
   extrapolating a current variation value from the first plurality of feedback data values;
   deriving a first pre-distortion value from the first plurality of feedback data values using the current variation value;
   generating a first input signal based on the first pre-distortion value; and
   providing the first input signal to the nonlinear device;
   extrapolation of the current variation value being bypassed by using a previous variation value if a noise level of at least one of the first plurality of feedback data values is above a threshold noise level.

2. The method for pre-distorting a nonlinear device as in claim 1, further comprising:
   generating a second output signal from the nonlinear device;
   detecting a second plurality of feedback data values from the second output signal;
   deriving a second pre-distortion value from the second plurality of feedback data values;
   generating a second input signal based on the second pre-distortion value; and
   providing the second input signal to the nonlinear device.

3. The method for pre-distorting a nonlinear device as in claim 1, further comprising:
   using an open loop pre-distortion value before detecting the first plurality of feedback data values from the first output signal;
   generating an open loop input signal based on the open loop pre-distortion value; and
   providing the open loop input signal to the nonlinear device.

4. The method for pre-distorting a nonlinear device as in claim 1, wherein deriving the first pre-distortion value further comprises:
   validating the first plurality of feedback data values.

5. A method for pre-distorting a nonlinear device, comprising:
   generating an output signal from the nonlinear device;
   detecting a plurality of feedback data values from the output signal;
   extrapolating a variation value from the plurality of feedback data values if an expected output signal value is beyond a range of feedback data values already detected and if a noise level of at least one of the plurality of feedback values is below a threshold;
   calculating a pre-distortion value using the variation value;
   generating an input signal based on the pre-distortion value;
   providing the input signal to the nonlinear device;
   processing the pre-distortion value;
   storing the processed pre-distortion value in a look-up-table; and
   storing a feedback data value corresponding to the processed pre-distortion value in the look-up-table.

6. The method for pre-distorting a nonlinear device as in claim 5, further comprising:
   using an open loop pre-distortion value before detecting the plurality of feedback data values from the output signal;
   generating an open loop input signal based on the open loop pre-distortion value; and
   providing the open loop input signal to the nonlinear device.

7. The method for pre-distorting a nonlinear device as in claim 5, further comprising:
   generating an interpolated variation value if the expected output signal value is within a range of feedback data values already detected;
   calculating an interpolated pre-distortion value using the interpolated variation value;
   generating an interpolated input signal based on the interpolated pre-distortion value; and
   providing the interpolated input signal to the nonlinear device.

8. The method for pre-distorting a nonlinear device as in claim 5, further comprising:
   discontinuing the extrapolation of the variation value and the calculation of the pre-distortion value after a desired number of the processed pre-distortion values are stored in the look-up-table;
   using at least one stored processed pre-distortion value and at least one corresponding stored feedback data value to generate an interpolated input signal; and
   providing the interpolated input signal to the nonlinear device.

9. The method for pre-distorting a nonlinear device as in claim 8, further comprising:
   restarting the extrapolation of the variation value and the calculation of the pre-distortion value;
   wherein the pre-distortion value is used to generate the input signal.

10. A nonlinear feedback control system, comprising:
    a nonlinear device having a first input and a first output and configured to generate a first output signal;
    a detection stage in communication with the first output of the nonlinear device and configured to detect a first plurality of feedback data values from the first output signal;
    a derivation stage in communication with the detection stage and configured to derive a first pre-distortion value from the first plurality of feedback data values, said derivation stage comprising a closed loop stage configured to extrapolate a current variation value from the first plurality of feedback data values, and calculate the first pre-distortion value using the current variation value; and the derivation stage being in communication with the first input of the nonlinear device to generate a first input signal based on the first pre-distortion value and provide the first input signal to the nonlinear device;

extrapolation of the current variation value being bypassed by using a previous variation value if a noise level of at least one of the first plurality of feedback data values is above a threshold noise level.

11. The nonlinear feedback control system as in claim 10, wherein the nonlinear device is a power amplifier.

12. The nonlinear feedback control system as in claim 10, further comprising:

a reference signal stage in communication with the derivation stage;

wherein the reference signal stage includes a phase or amplitude signal.

13. The nonlinear feedback control system as in claim 10, further comprising:

the nonlinear device having a second input and second output;

the detection stage in communication with the second output of the nonlinear device; and the derivation stage in communication with the second input of the nonlinear device.

14. The nonlinear feedback control system as in claim 10, wherein the derivation stage further comprises:

an open loop stage connected in parallel with the closed loop stage.

15. The nonlinear feedback control system as in claim 10, wherein the closed loop stage further comprises:

an interpolation stage.

* * * * *